(12) United States Patent
Ohkubo et al.

(10) Patent No.: US 7,199,939 B2
(45) Date of Patent: Apr. 3, 2007

(54) IMMERSION OPTICAL SYSTEM AND OPTICAL APPARATUS HAVING THE SAME

(75) Inventors: Akinori Ohkubo, Utsunomiya (JP); Tokuyuki Honda, Tokyo (JP); Hideki Morishima, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/319,195

(22) Filed: Dec. 28, 2005

(65) Prior Publication Data
US 2006/0146662 A1 Jul. 6, 2006

(30) Foreign Application Priority Data
Jan. 5, 2005 (JP) .............................. 2005-000616

(51) Int. Cl.
*G02B 3/12* (2006.01)
(52) U.S. Cl. ..................................... 359/665
(58) Field of Classification Search ......... 359/665–667
See application file for complete search history.

(56) References Cited

FOREIGN PATENT DOCUMENTS

JP 2000-58436 2/2000
JP WO 2005/059654 A1 6/2005

OTHER PUBLICATIONS

Smith, Bruce W., et al. "Approaching the numerical aperture of water—Immersion lithography at 193nm," Rochester Institute of Technology, Microelectronic Engineering Department, 12 pages.

*Primary Examiner*—Scott J. Sugarman
*Assistant Examiner*—Darryl J. Collins
(74) *Attorney, Agent, or Firm*—Fitzpartick, Cella, Harper & Scinto

(57) ABSTRACT

An immersion optical system that condenses light from a light source toward a first surface includes a lens having a concave lens surface closest to the first surface, a liquid being filled in a space between the concave lens surface and the first surface, wherein a conditional equation $d > L/[2 \times \tan\{\arcsin(NA/ni)\}]$ is met, where d is a distance between a first point and a second point when the distance becomes maximum between the first point on the concave lens surface and the second point on the first surface in a direction substantially orthogonal to the first surface, L/2 is a maximum distance from the second point to an edge of an irradiation area of the light on a first surface, NA is a numerical aperture of the immersion optical system, and ni is a refractive index of the liquid.

6 Claims, 20 Drawing Sheets

PRIOR ART

IMMERSION OPTICAL SYSTEM AND OPTICAL APPARATUS HAVING THE SAME

BACKGROUND OF THE INVENTION

The present invention relates generally to an optical system that converges the light from a light source onto a target, and more particularly to an immersion optical system that fills a liquid between a final lens surface and a target and an optical apparatus having the immersion optical system.

For an improved resolution of an optical system, such as a microscope and a semiconductor exposure apparatus, the immersion lithography is used which fills an immersion material having a refractive index greater than 1 in a space between a target and a final lens surface of an optical system and improves an effective numerical aperture ("NA"). The final lens surface of the optical system for the immersion lithography is often designed to a plane for filling easiness of the immersion material in the space.

FIG. 18 shows an optical system that uses the conventional immersion lithography. The optical system includes a final lens 201 and an immersion material 202. The light is incident upon a lens 201, passes through the immersion material 202, and is converged at a maximum incident angle $\theta i$ onto a target 203. The optical system has an NA below, where ni is a refractive index of the immersion material:

$$NA = ni \times \sin \theta i$$

Resolution R and depth of focus DOF are expressed as follows, where $\lambda$ is a wavelength, k1 and k2 are proportionality factors that depend upon a process and an illumination condition:

$$R = k1 \times \lambda / NA$$

$$DOF = k2 \times \lambda / [2 \times ni \times \{1 - (1 - (NA/ni)^2)^{1/2}\}]$$

Hence, as the NA is made larger, a value of the resolution R reduces and provides a fine optical image.

The larger NA increases the depth of focus DOF, and mitigates a deterioration of an optical image due to a target position error and a focus position error.

Where air having a refractive index of 1.0 is filled in a space between the lens and the target, and the maximum incident angle in the air is $\theta 0$, at which the light is incident upon the target, the maximum angle of $\theta 0$ is 90°, the maximum value of NA is 1, and it is impossible to reduce the resolution R. However, when the immersion material having a refractive index ni greater than 1 is filled between a space between the lens and the target, NA can be made greater than 1, and the depth of focus DOF can be increased irrespective of a smaller resolution (higher resolving power).

When the optical system uses a flat final surface, a spherical aberration occurs between an existence and a non-existence of the immersion material due to a thickness of the immersion material. In order to reduce this aberration, one proposed technology defines a radius of curvature of a final surface of an immersion projection optical system in a semiconductor exposure apparatus. See, for example, Japanese Patent Application, Publication No. 2000-58436, paragraph nos. 0009-0011, FIG. 2, etc.

FIG. 19 is a view around a final lens in a conventional immersion projection optical system. As illustrated, the immersion projection optical system includes a final lens 201, an immersion material 202, and a tank 204 that stores the immersion material 202. The light 200 is incident upon the lens 201, and passes the immersion material 202, and is converged at a maximum incident angle $\theta i$ onto the target 203. The lens 201 has a concave spherical, final surface having a center at one point on the target 203. When this shape is used and the light is incident perpendicularly upon an interface between the final surface of the lens 201 and the immersion material 202, the light is condensed on the target 203 without refractions irrespective of a refractive index difference. This configuration prevents a spherical aberration that would otherwise occur in case of a plane-parallel plate, even when the immersion material is removed.

However, as shown in FIG. 18, when the final lens surface is plane, a maximum value NA0 of NA is determined by a refractive index ni of the immersion material and the maximum incident angle $\theta i$ in the immersion material under condition of ni0<nl, where nl is a refractive index of a glass material of the lens, and ni0 is a refractive index of the immersion material, as follows:

$$NA0 = ni0 \times \sin \theta i$$

While the theoretical maximum value of $\sin \theta i$ is 1, the refractive index on the final lens surface actually suddenly increases as it becomes close to 1, and NA cannot be increased up to the refractive index of the immersion material.

In addition, in an attempt to use the immersion material having a refractive index ni higher than a refractive index of a glass material nl for an increased NA, the maximum value NA1 of NA is determined by the refractive index nl of the glass material and the maximum incident angle $\theta 1$ upon the glass material as follows:

$$NA1 = nl \times \sin \theta l$$

This configuration can increase NA greater than ni0 but not greater than the refractive index nl of the glass material, because of a relationship ni0<nl<ni and the theoretical maximum value $\sin \theta i$ of 1. In other words, even in an attempt to use the immersion material having a refractive index greater than that of the lens glass material, the rays having large incident angles in the light incident upon the final lens surface are totally reflected on the final lens surface and never reach the target. Therefore, the NA of the optical system cannot be increased up to the refractive index of the glass material. Moreover, the NA cannot be theoretically increased greater than the refractive index of the glass material.

FIG. 20 shows an NA dependency of the light intensity reflectance on the final lens surface or a maximum incident angle dependency of the light, where the refractive index nl of the glass material is 1.50, the refractive index ni of the immersion material is 1.63, and the incident light is a p-polarized light. FIG. 21 also shows an NA dependency of the reflectance where the incident light is an s-polarized light. From these figures, when the NA approaches to the refractive index nl of the glass material of 1.50, e.g., 16.5% of the p-polarized light and 22.4% of the s-polarized light are reflected in the light having the maximum incident angle when NA=1.48, and the imaging characteristic suddenly deteriorates. Thus, the NA cannot be increased up to the refractive index of the glass material. In addition, in an attempt to increase NA up to the refractive index of the glass material, the light having the maximum incident angle is entirely reflected, and it is thus impossible to make NA of the optical system equal to and greater than the refractive index of the glass material.

One solution for this problem that NA of the optical system cannot be increased up to the refractive index of the glass material with a plane final lens surface is to provide the final lens surface with a shape having a radius of curvature corresponding to the NA. Nevertheless, a structure that defines the radius of curvature of the final lens surface, as in the above prior art reference, does not weigh the spread of an area in which the light is irradiated onto the target, and cannot form a good optical image on an entire surface of the light irradiation area, although a good optical image can be obtained at one focal position proportional to λ/NA.

BRIEF SUMMARY OF THE INVENTION

The present invention is directed to an immersion optical system that increases an NA up to a refractive index of a glass material of a final lens, and an optical apparatus having the immersion optical system.

An immersion optical system that condenses light from a light source toward a first surface includes a lens having a concave lens surface closest to the first surface, a liquid being filled in a space between the concave lens surface and the first surface, wherein a conditional equation d>L/[2×tan{arcsin(NA/ni)}] is met, where d is a distance between a first point and a second point when the distance becomes maximum between the first point on the concave lens surface and the second point on the first surface in a direction substantially orthogonal to the first surface, L/2 is a maximum distance from the second point to an edge of an irradiation area of the light on a first surface, NA is a numerical aperture of the immersion optical system, and ni is a refractive index of the liquid.

An optical apparatus having the above immersion optical system, and an exposure apparatus having the above immersion optical system constitute also one aspect of the present invention.

A device manufacturing method according to still another aspect of the present invention includes the steps of exposing a target using the above exposure apparatus, and developing the target that has been exposed.

Other objects and further features of the present invention will become readily apparent from the following description of the preferred embodiments with reference to accompanying drawings.

DETAILED DESCRIPTION OF THE PREFERRED EMBODIMENTS

Referring now to the accompanying drawings, a description will be given of preferred embodiments according to the present invention.

Figure 1:
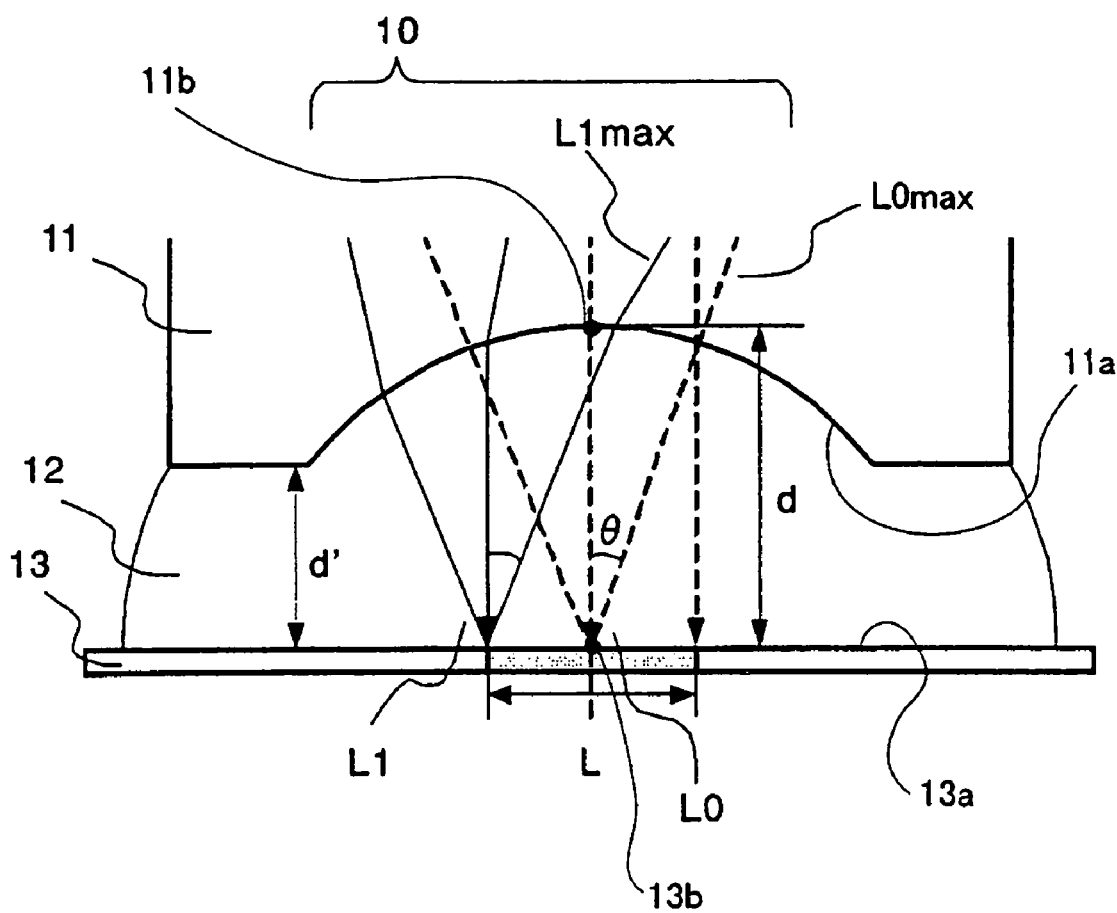
FIG. 1 is a sectional view showing an immersion optical system according to a first embodiment of the present invention.

FIG. 1 shows a structure of a principal part in an immersion optical system according to a first embodiment of the present invention. The optical system uses at least one of refractive and reflection systems (not shown) to introduce light 10 from a light source (not shown) to a final lens 11 closest to a first or image plane 13a on which a target 13 is located, and transmits the light emitted from a lens surface 11a of a final lens 11 at the target side (or closest to the target 13 in the optical system), which is referred to as a final lens surface hereinafter, through an immersion material as a liquid that fills a space between the final lens surface 11a and the target 13, forming a predetermined light irradiation area L on the first surface 13a. The light 10 that has passed through the final lens 11 transmits or is refracted at an interface between the final lens 11a and the immersion material 12, and converges and proceeds to the target 13.

Light L0 in the incident light 10 is condensed on the center of the light irradiation area L, and light L1 is condensed on the edge of the light irradiation area L.

The final lens surface 11a has a concave shape at the target side. A distance is set to "d" between a first point 11b and a second point 13b when the distance becomes maximum between the first position 11b on the final lens surface 11a and the second point 13b on the first surface 13a in a direction substantially orthogonal to the first surface 13a on the final lens surface 11a.

The first point 11b is generally a point on an optical axis of the final lens 11 or a rotationally symmetrical axis, or in other words, a center of the final lens surface 11a. An intersection between the optical axis or rotationally symmetrical axis and the first surface on the target 13 is a center of the light irradiation area L. This embodiment makes the first surface 13a plane corresponding to an ideal image plane with no aberration.

The "direction substantially orthogonal to the first surface 13a" intends to cover not only a direction that is accurately orthogonal to the first surface 13a but also other directions inclined to the orthogonal direction within a permissible range that negligibly affects the optical performance. The straight line in this direction may be referred to as a normal in the following description.

Figure 14:
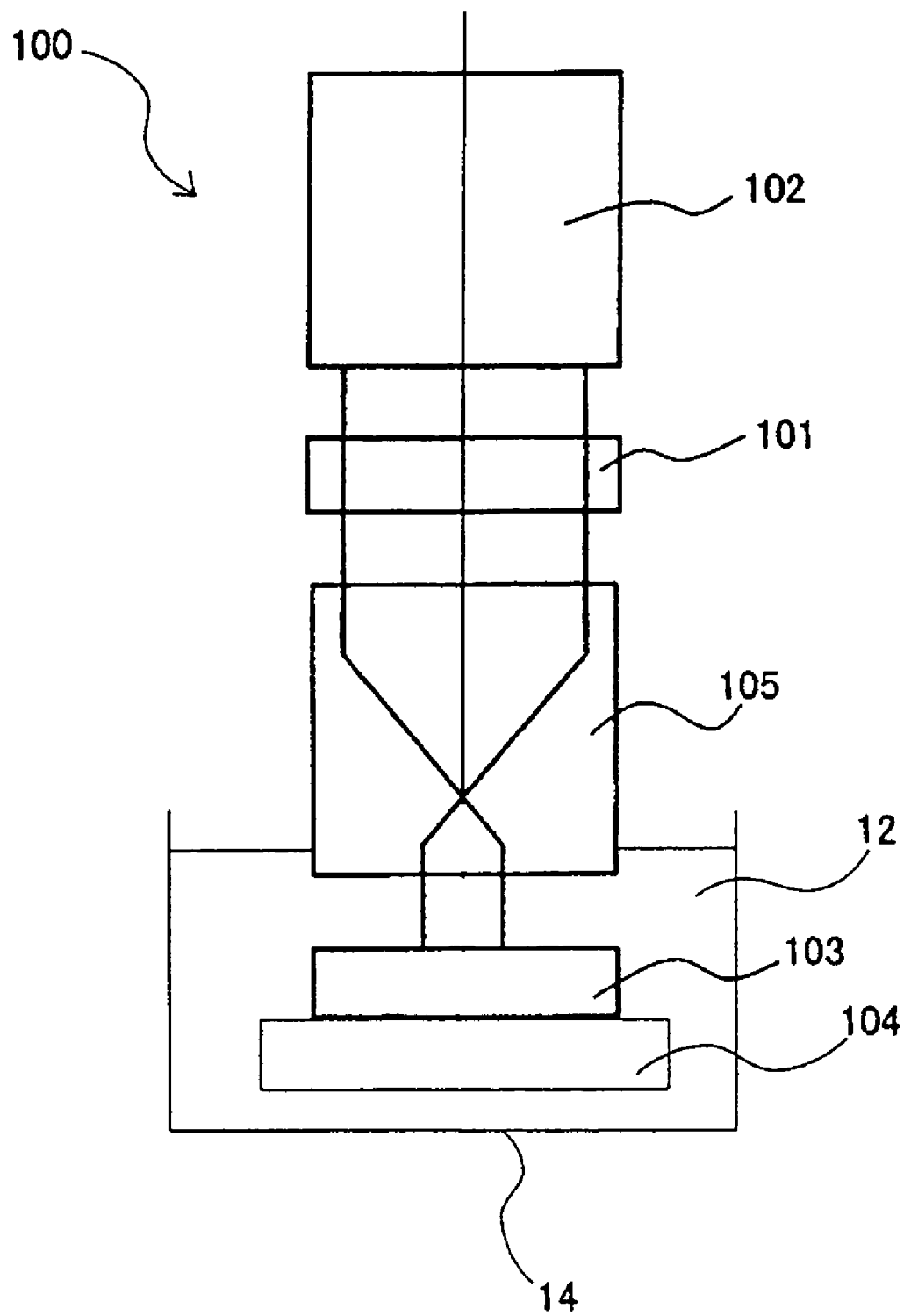
FIG. 14 is a schematic view showing a structure of a semiconductor exposure apparatus having the immersion optical system according to the first embodiment.

Referring now to FIG. 14, a description will be given of a semiconductor exposure apparatus that is one type of optical apparatuses and applies the above structured immersion optical system to a projection optical system.

A description will now be given of an exposure apparatus according to one aspect of the present invention, with reference to FIG. 14. Here, FIG. 14 is a block diagram of a schematic structure of an exposure apparatus.

The exposure apparatus 100 is a projection exposure apparatus that exposes onto the wafer 103 a circuit pattern of the reticle 101, for example, in a step-and-repeat manner. Of course, the exposure apparatus 100 is applied to a step-and-scan manner. Such an exposure apparatus is suitable for a sub-micron or quarter-micron lithography process. This embodiment exemplarily describes a step-and-scan exposure apparatus (which is also called "a scanner").

The "step-and-scan manner," as used herein, is an exposure method that exposes a reticle pattern onto a wafer by continuously scanning the wafer relative to the reticle, and by moving, after an exposure shot, the wafer stepwise to the next exposure area to be shot. The "step-and-repeat manner" is another mode of exposure method that moves a wafer stepwise to an exposure area for the next shot, for every cell projection shot.

The illumination apparatus 102 illuminates the reticle 101 that has a circuit pattern to be transferred, and includes a light source unit and an illumination optical system.

The light source unit uses, for example, a laser light source, such as an ArF excimer laser with a wavelength of approximately 193 nm, a KrF excimer laser with a wavelength of approximately 248 nm, and a $F_2$ laser with a wavelength of approximately 157 nm. However, the laser type is not limited to excimer lasers and, for example, and a YAG laser may be used. Similarly, the number of laser units is not limited.

For example, two independently acting solid lasers would cause no coherence between these solid lasers and significantly reduces speckles resulting from the coherence. An optical system for reducing speckles may swing linearly or rotationally. When the light source unit uses the laser, it is desirable to employ a beam shaping optical system that shapes a parallel beam from a laser source to a desired beam shape, and an incoherently turning optical system that turns a coherent laser beam into an incoherent one. A light source applicable for the light source unit is not limited to a laser, and may use one or more lamps such as a mercury lamp and a xenon lamp.

The illumination optical system is an optical system that illuminates the reticle 101 using the light from a light source unit, and includes a lens, a mirror, a light integrator, a stop, and the like. For example, the illumination optical system includes, in order from the light source unit side, a condenser lens, a fly-eye lens, an aperture stop, a condenser lens, a slit, and an imaging optical system. The illumination optical system can use any light regardless of whether it is axial or non-axial light. The light integrator may include a fly-eye lens or an integrator formed by stacking two sets of cylindrical lens array plates (or lenticular lenses), and can be replaced with an optical rod or a diffractive optical element.

The reticle 101 is made, for example, of quartz, has a circuit pattern or image to be transferred, and is supported and driven by a reticle stage (not shown). The diffracted light emitted from the reticle 101 passes through the projection optical system 105 and is then projected onto the wafer 103. The plate 103 is a target to be exposed, and the resist is applied on its irradiated surface. The reticle 101 and the wafer 103 are located in an optically conjugate relationship.

The scanner scans the reticle and the wafer and transfers the reticle pattern onto the wafer. A step-and-repeat exposure apparatus (referred to as a "stepper") maintains the reticle and the plate still when exposing the reticle pattern.

The optical projection system 105 projects the reticle pattern onto the wafer 103. In the projection optical system 105, any necessary correction of the chromatic aberration may be accomplished by using a plurality of lens units made from glass materials having different dispersion values (Abbe values) or arranging a diffractive optical element such that it disperses light in a direction opposite to that of the lens unit.

The photoresist is applied onto the wafer 103. A photoresist application step includes a pretreatment, an adhesion accelerator application treatment, a photo-resist application treatment, and a pre-bake treatment. The pretreatment includes cleaning, drying, etc.

The adhesion accelerator application treatment is a surface reforming process to enhance the adhesion between the photoresist and a base (i.e., a process to increase the hydrophobicity by applying a surface active agent), through a coat or vaporous process using an organic coating such as HMDS (Hexamethyl-disilazane). The pre-bake treatment is a baking (or burning) step, which makes the photoresist softer than after development and removes the solvent.

The stage 104 supports the wafer 103. The stage 104 may use any structure known in the art, and thus a detailed description of its structure and operation is omitted. The stage 104 may use, for example, a linear motor to move the wafer 103 in the XY directions (e.g., a horizontal direction). The reticle 101 and wafer 103 are, for example, scanned synchronously, and the positions of the stage 104 and a reticle stage (not shown) are monitored, for example, by a laser interferometer and the like, so that both are driven at a constant speed ratio. The stage 104 is installed on a stage stool supported on the floor and the like, for example, via a dampener. The reticle stage and the projection optical system 105 are installed on a barrel stool support (not shown), for example, via a dampener, to the base frame placed on the floor.

In an exposure process, the light is emitted from the light source unit in the illumination apparatus 102, e.g., Koehler-illuminates the reticle 101 via the illumination optical system. The light that passes through the reticle 101 and reflects the reticle pattern is imaged onto the wafer 103 by the projection optical system 105. The image of the reticle pattern is reduced by the projection optical system 105 and formed on the wafer 103.

A detailed description will now be given of the projection optical system 105, with reference to FIG. 1. The light (which is a laser light having a wavelength of 193 nm in this embodiment) that has passed the illumination optical system and the reticle 101 is incident upon the projection optical system 105, and reaches the final lens 11 in the projection optical system 105.

The light that reaches the final lens 11 is irradiated onto the wafer 13 as a target via the final lens 11 and immersion material 12. The resist that interacts with the light is applied onto the wafer 13, and the reticle pattern is imaged and transferred onto the resist in the wafer 13. In this case, in order to improve the throughput of the semiconductor exposure, the pattern area to be transferred onto the wafer 13 should have a predetermined size. The scanning semiconductor exposure apparatus that uses the ArF laser determines the light irradiating area on the reticle by a predetermined sized slit, and the light is imaged on the wafer 13, in an area having a size times the magnification of the projection optical system.

A reticle has 6 inches square; when the projection optical system has a magnification of ¼, a maximum length of a light irradiating area is about 26 mm on the wafer 13.

As discussed above, when the final lens surface is plane and the refractive index n1 of the glass material and the refractive index ni0 of the immersion material satisfy ni0<ni, the maximum value NA0 of NA is determined by the refractive index ni0 of the immersion material and the maximum incident angle θi upon the immersion material as follows:

$$NA0 = ni0 \times \sin \theta i$$

While the maximum value of sin θi is theoretically 1, the refractive index on the final lens surface actually suddenly increases as it becomes close to 1, and the NA cannot be increased up to the refractive index of the immersion material. One solution for this problem is to use a concave shape for the final lens surface, but a simple concave shape having a radius of curvature and a center at one point on the wafer 13 has a difficulty in obtaining a good imaging characteristic throughout a light irradiating area on the target.

Figure 2:
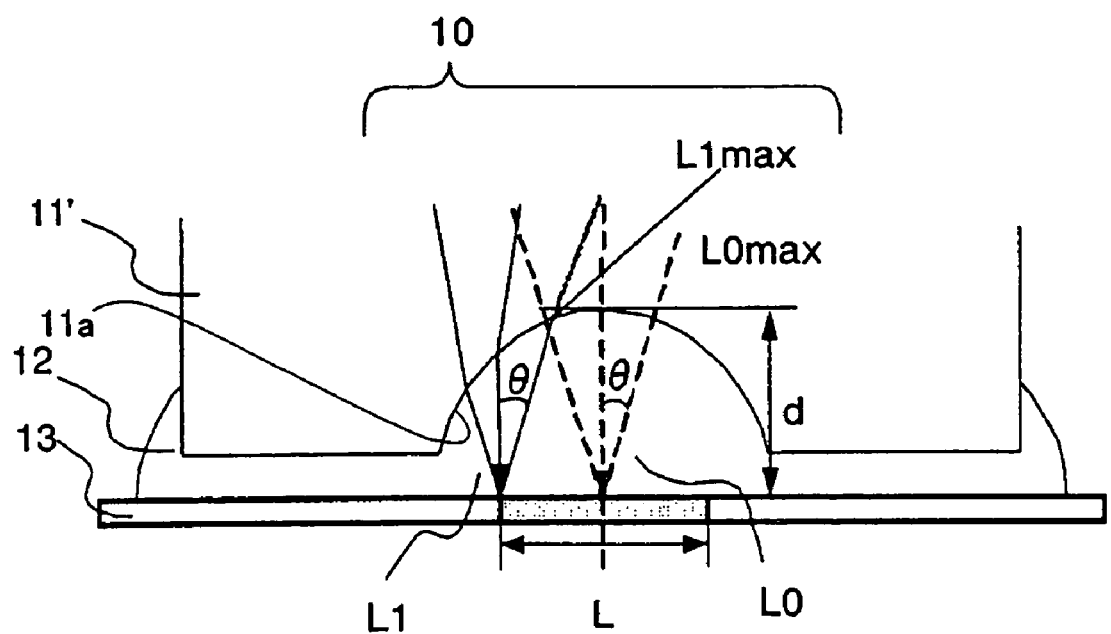
FIG. 2 is a sectional view showing an immersion optical system as a comparative example.

FIG. 2 shows an immersion optical system that uses final lens surface that has a spherical shape and a radius of curvature with a center at one point on the wafer 13. FIG. 2 shows a final lens 11' having a final lens surface 11a' that possesses the radius of curvature d and a concave spherical shape, an immersion material 12, and a wafer 13 arranged at a position apart by the distance d from the final lens 11'. The incident light 10 introduced from the light source (not shown) to the final lens 11' transmits through the final lens 11', transmits or is refracted at an interface between the final lens surface 11a' and the immersion material 12, and illuminates an exposure area L on the wafer 13.

Light L0 in the incident light 10 is condensed on the center of the exposure area L, and light L1 is condensed on the edge of the exposure area L. Since the light L0 is condensed at the center of the radius of curvature of the final lens surface 11a', the light of the maximum incident angle θ is incident perpendicularly upon the interface between the final lens surface 11a' and the immersion material 12. This configuration prevents an increase of the refractive index or a decrease of the transmittance.

Light L1max having a maximum incident angle in the light L1 is irradiated onto the edge of the exposure area L at the incident angle θ in the immersion material 12.

Here, for example, when a normal of the target (wafer) 13 which passes the center of the exposure area L passes the center of the final lens 11', a distance between a light irradiating area or exposure area L on the target 13 and an intersection between the normal and the target 13 (or a second point) has a maximum value of L/2.

When d×tanθ<L/2 is met, the light L1max having the maximum incident angle with a plane final lens surface has a larger angle incident upon the interface between the final lens surface and the immersion material than that with a concave final lens surface. As the transmittance decreases, the light is totally reflected, and the imaging characteristic deteriorates at the edge of the light irradiating area L.

As a result, a good imaging characteristic is unavailable throughout the light irradiating area L. The optical system if applied to a semiconductor exposure apparatus greatly fluctuates a transferred pattern within the exposure area and causes a non-resolved pattern, unsuitable for a manufacture of a semiconductor circuit pattern.

On the other hand, as shown in FIG. 1, a conditional equation d×tan θ>L/2 can reduce the maximum incident angle of the light L1max upon the interface, making the maximum incident angle larger than with the plane final lens surface. In other words, the NA can be increased even at the edge of the exposure area L.

A range of the distance d is expressed below, where NA is a value of NA and arcsin is an inverse trigonometric function:

$$d > L/[2 \times \tan \{\arcsin(NA/ni)\}]$$

Use of a thus structured immersion optical system would increase the NA up to the refractive index ni0 of the immersion material even at the edge of the light irradiating area. In other words, the exposure apparatus can maintain the good imaging characteristic throughout the exposure area and a high NA.

When the refractive index nl of the glass material and the refractive index ni0 of the immersion material satisfy a relationship ni0<nl, it is theoretically impossible to increase NA up to ni0. Accordingly, assume the following conditional equation is met in an attempt to use the immersion material having a refractive index ni higher than the refractive index nl of the glass material:

$$(ni0<)nl<ni \quad (1)$$

In this case, when the final lens surface is a plane, the maximum value NA1 of NA is determined by the refractive index nl of the glass material and the maximum incident angle θ1 upon the glass material as follows:

$$NA1 = nl \times \sin \theta1$$

As understood from this equation, when the final lens surface is plane, NA can be increased up to ni0 but not up to the refractive index nl.

On the other hand, when the concave final lens surface with a conditional equation nl<ni, and d is set as follows, NA can be increased up to the refractive index nl of the glass material even at the edge of the light irradiating area L:

$$d > L/[2 \times \tan \{\arcsin(NA/ni)\}] \quad (2)$$

Thereby, the exposure apparatus can maintain the good imaging characteristic throughout the exposure area and a higher NA than the conventional one.

For example, when the light source has the ArF laser having the wavelength λ of 193 nm and a glass material of a final lens is $CaF_2$ (calcium fluoride), the refractive index nl becomes 1.50. When the immersion material uses 17% $H_3PO_4$ (phosphoric acid), as disclosed in Bruce W. Smith, Anatoly Bourov, Yongfa Fan, Lena Zavalova, Neal Lafferty and Frank Cropanse, "Approaching the numerical aperture of water—Immersion lithography at 193 nm," Proc. SPIE. Vol. 5377, P. 281 (2004), the refractive index nl of 1.63 is obtained at the wavelength of 193 nm.

Figure 3:
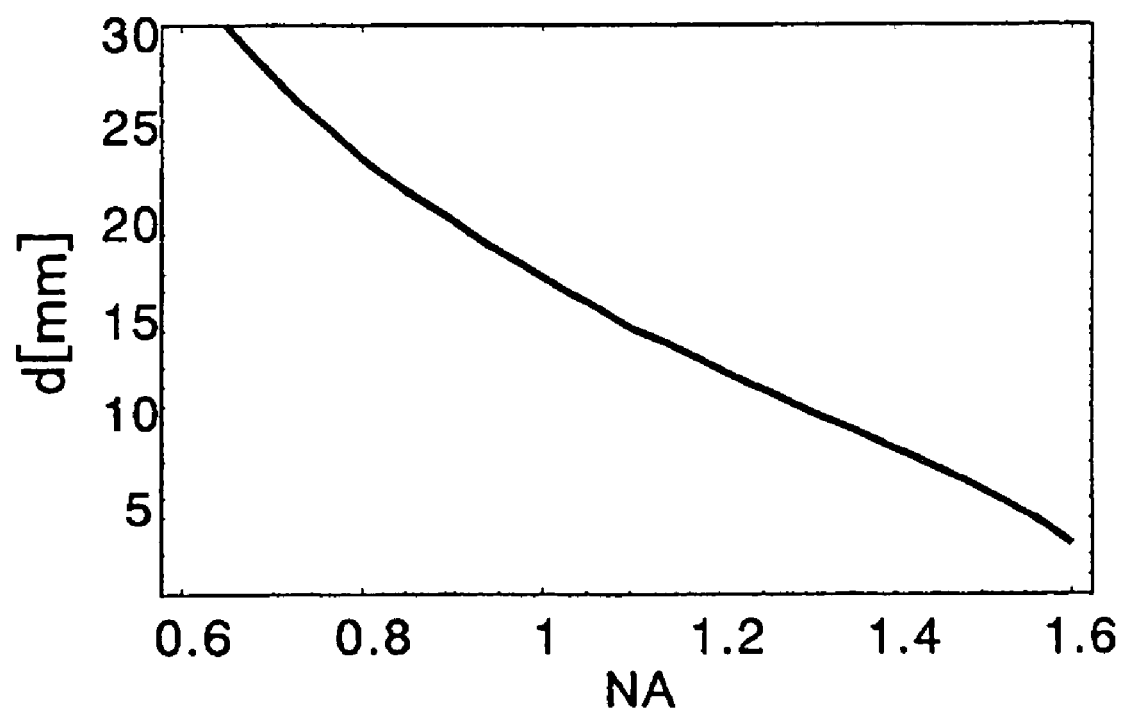
FIG. 3 is a graph showing a relationship between NA of an optical system and a distance d between a wafer and a lens.

Even when the refractive index ni of the immersion material is higher than the refractive index nl of the glass material of the final lens, use of the optical system of this embodiment would increase the NA up to the refractive index nl of the glass material of 1.50, and provide an exposure apparatus having NA=1.50 throughout the exposure area. In addition, this configuration can realize an exposure apparatus having an NA near 1.50. A relationship between NA and the distance d from the center of the exposure area L on the wafer 13 to the center of the final lens surface 11a is like a relationship shown in FIG. 3, when the length of the exposure area L is set to 26 mm. As understood from this view, d>2.5 mm is enough for an optical system having an NA of 1.60.

The light's transmittance decreases when the immersion material absorbs the light. As the transmittance decreases, the light intensity irradiated upon the wafer lowers and the exposure time ET becomes longer. As a result, the number of wafers exposable per a unit time or throughput decreases. As the throughput decreases, the cost of the semiconductor integrated circuit chip increases and thus the throughput must be made as high as possible. The throughput is determined by the wafer feeding, wafer scanning, alignments, and exposure time ET.

If a permissible increase of the exposure time ET is double the usual one, the exposure time ET becomes shortened in inverse proportion to a transmittance T. Therefore, the transmittance T of 50% or greater is necessary.

Here, T is given as follows, where $\alpha$ is an absorption coefficient of the immersion material, and d is a distance between the final lens surface and the wafer surface:

$$T = 10^{-\alpha \times d}$$

Here, the absorption coefficient $\alpha$ is an inverse of a distance at which an intensity of the light that passes the liquid becomes one-tenth. In order for T>50%, the following conditional equation should be met:

$$d < 0.30/\alpha \quad (3)$$

As long as the distance d satisfies this relationship, the drop of the throughput may be restrained within a practical range. For example, when the immersion material is water, $\alpha$ becomes about 0.036 cm$^{-1}$ and d<8.3 cm is met with the wavelength of 193 nm according to M. Switkes, R. R. Kunz, R. F. Sinta, M. Rothchild, P. M. Gallagher-Wetmore, V. J. Krukonis and K. Williams, "Immersion Liquids for Lithography in the Deep Ultraviolet," Proc. SPIE, Vol. 5040, P. 690 (2003).

When the final lens surface has a concave shape and the nozzle is arranged around the final lens surface, the immersion material can be inserted and circulated only in a light irradiating area between the final lens and the wafer. Air bubbles are generated and likely to remain on the bottom of the final lens surface. In this case, for example, a method that arranges the final lens surface and the wafer in the immersion material stored in a tank is preferred to a so-called local fill method that fills the immersion material only in the light irradiating area between the lens and the wafer disclosed in Japanese Patent Publication No. 63-49893.

Figure 4:
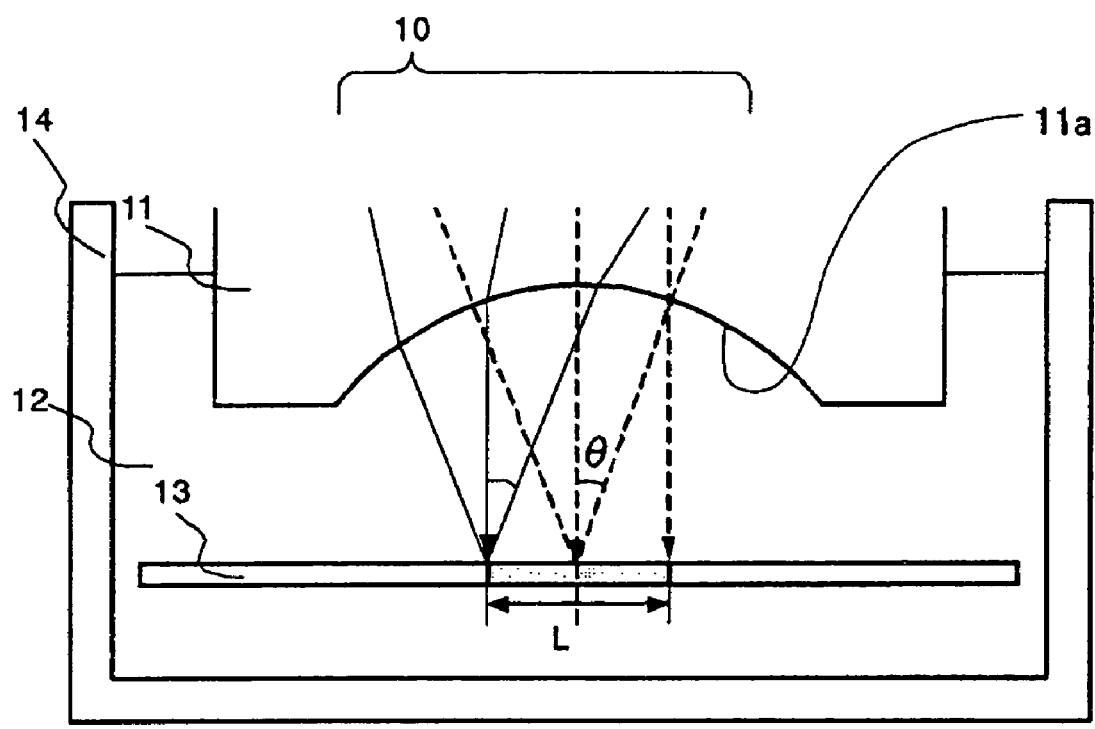
FIG. 4 is a sectional view of an immersion optical system according to the first embodiment, which has a tank that stores an immersion material.

FIG. 4 shows the structure in this case, and illustrates a tank 14 that stores the immersion material 12, the final lens 11 and the wafer 13. The final lens 13 is arranged such that the center of the final lens surface 11a is lower than the in-tank height of the immersion material 12 in the tank 14. The wafer 13 is kept away from the final lens surface 11a in the immersion material 12 in the tank 14 by the distance d. This structure would enable the wafer stage (not shown) to scan the wafer 13 for sequential exposure without generating air bubbles or causing the air bubbles to be attached to the concave final lens 11a. Therefore, a pattern can be transferred with no defect over the entire exposure area.

The immersion material 12 in the tank 14 is likely to get damaged chronologically due to a liquation from the resist on the wafer 13, due to a liquation due to reactions between the light and the resist, due to fine particles caused by actions of the wafer stage. On the other hand, it is possible to always maintain a predetermined constant optical characteristic and reduce contaminations upon the lens surface by circulating the immersion material 12.

Figure 5:
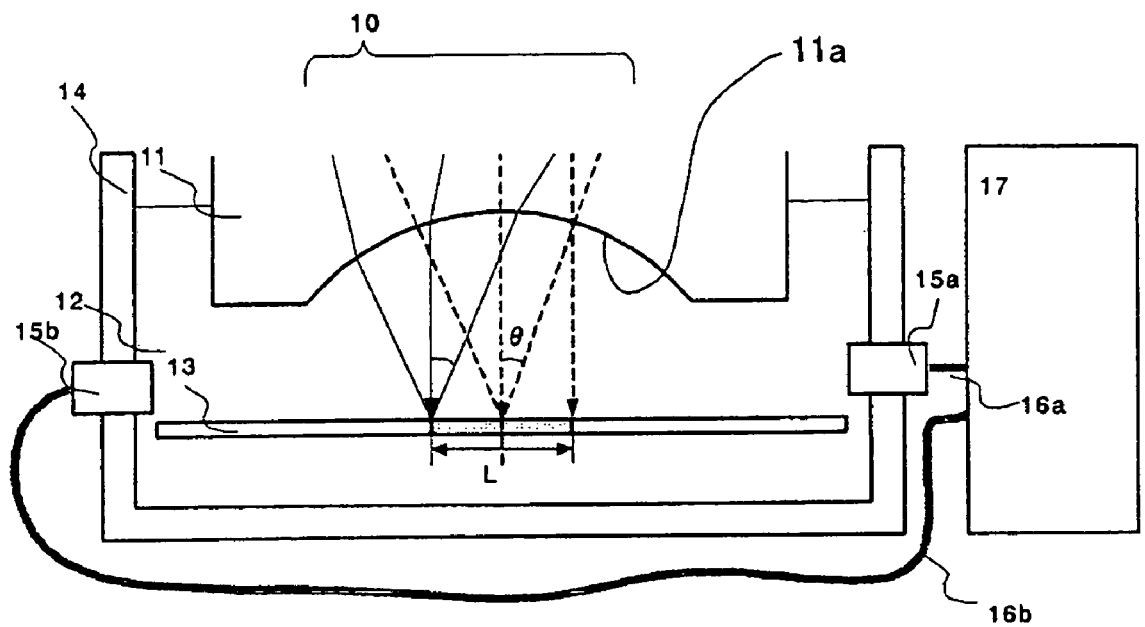
FIG. 5 is a sectional view of an immersion optical system according to the first embodiment, which has an apparatus that circulates the immersion material.

FIG. 5 shows the structure in this case, and illustrates, in addition to the structure shown in FIG. 4, a storage system 17, an injector 15a, a pipe 16a, a collector 15b, and a pipe 16b. The storage system 17 purifies the immersion material 12 using a chemical filter and a normal filter. The injector 15a injects the immersion material 12 purified by the storage system 17, into the tank 14. The pipe 16a connects the storage system 17 and the injector 15a with each other. The collector 15b collects the immersion material 12 from the tank 14. The pipe 16b connects the collector 15b and the storage system 17 to each other.

The filter etc. remove fine particles and chemicals from the immersion material 12 collected by the collector 15b to the storage system 17, and the resultant immersion material 12 is stored. The injector 15a injects the stored immersion material 12 into the tank 14. Thereby, the immersion material 12 circulates so that its physical property value becomes constant and genuine. This configuration can restrain adhesions of impurities to the final lens surface 11a, and realize the immersion optical system with few deteriorations of imaging characteristic on the wafer 13.

Figure 6:
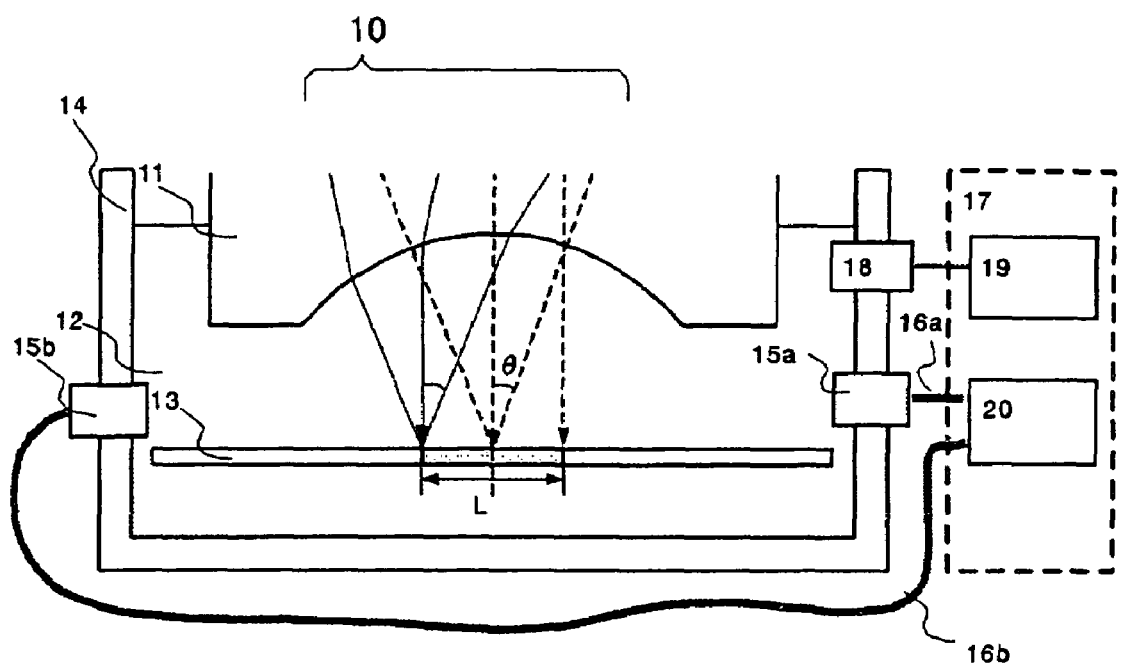
FIG. 6 is a sectional view of an immersion optical system according to the first embodiment, which has a temperature monitor of the immersion material.

The temperature of the immersion material 12 rises due to the light absorption, and its refractive index fluctuates, thereby posing a problematic deterioration of the imaging characteristic. In this case, as shown in FIG. 6, for example, a temperature measuring apparatus 18, a temperature controller 19, and a flow controller 20 may be provided in addition to the structure shown in FIG. 5. In this case, the temperature measuring apparatus 18 measures the temperature of the immersion material 12 in the tank 14. The temperature controller 19 and the flow controller 20 are electrically connected to the temperature measuring apparatus 18 in the storage system 17.

As the temperature of the immersion material 12 rises measured by the temperature measuring apparatus 18, the injector 15a injects the immersion material 12 in the storage system 17, which has a constantly maintained temperature by the temperature controller 19, and the collector 15b collects the immersion material 12, which has a varied temperature from the tank 14, thereby circulating the immersion material 12 in the tank 14.

The flow controller 20 controls the flow of the immersion material 12 to be circulated so that the temperature variation of the immersion material 12 falls within a predetermined range. Use of such a structure would maintain constant the refractive index of the immersion material 12, and compensate the imaging characteristic. Moreover, almost constant temperature the immersion material 12 in the tank 14 can maintain constant the temperatures of the final lens 11 and the wafer 13. This configuration can prevent a thermal deformation of the wafer 13, and transfer a pattern onto an accurate position on the wafer 13.

When the immersion material 12 is exchanged to a different material, the refractive index changes and the imaging characteristic varies on the wafer 13. One solution for this problem is to measure the refractive index of the immersion material 12, and to use an optical system that corrects the aberration that would otherwise occur with the refractive index.

Figure 7:
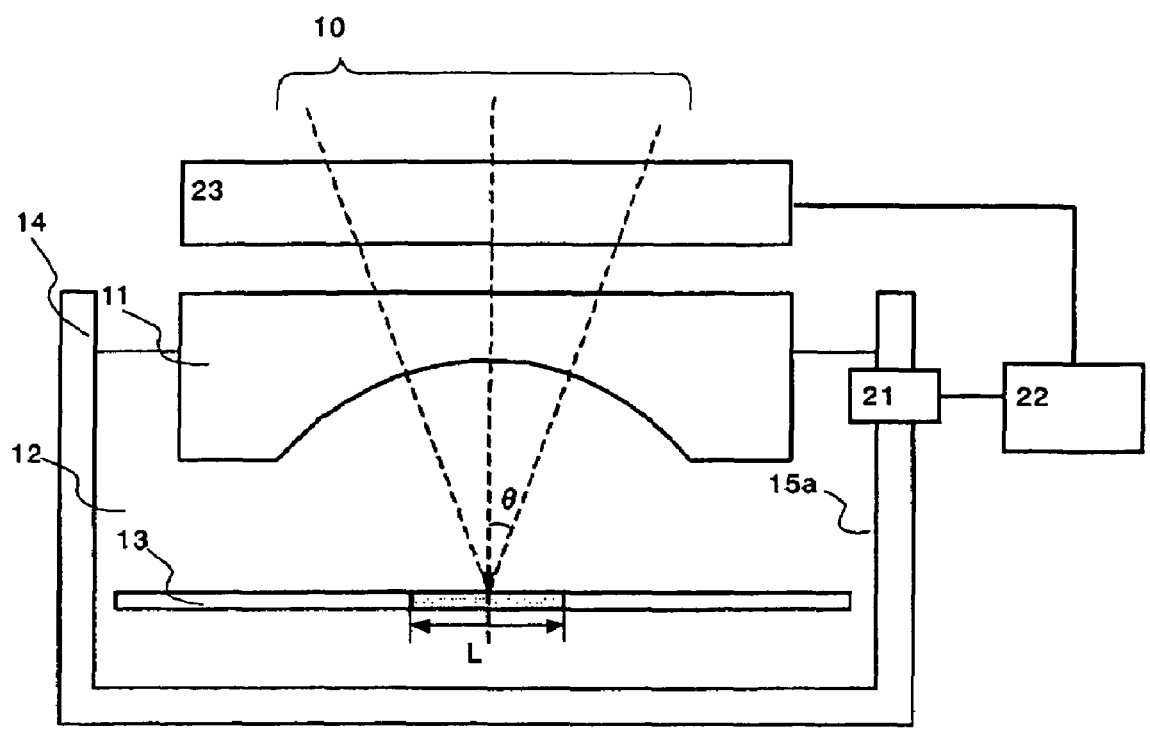
FIG. 7 is a sectional view of an immersion optical system according to the first embodiment, which has a wavefront correction apparatus and a refractive index monitor of the immersion material.

FIG. 7 shows an optical system shown in FIG. 4, a refractive index measuring apparatus 21 provided in the tank 14, a wavefront aberration correcting optical system 23 that corrects the aberration, and a controller 22 that controls the wavefront aberration correcting optical system 23 in accordance with the refractive index measured by the refractive index measuring apparatus 21.

The refractive index measuring apparatus 21 irradiates a laser beam onto the immersion material 12, and measures the refractive index of the immersion material 12 using a method that measures a refraction angle of the laser beam that transmits through the immersion material 12. The controller 22 calculates a wavefront aberrational amount to be corrected, and operates the wavefront aberration correcting optical system 23, based on the design value of the known optical system and the refractive index measured by the refractive index measuring apparatus 21.

The wavefront aberration correcting optical system 23 corrects an aberration through an expander structure or by mechanically and thermally deforming an optical system. The wavefront aberration correcting optical system 23 may be an optical system that corrects a wavefront through mechanical fine fluctuations of the mirror.

Use of this configuration would provide a good imaging performance on the wafer 13 even when immersion materials having different physical property values are used. In addition, even when the refractive index varies due to the temperature and chemical variations of the immersion materials, this configuration corrects the aberration that would otherwise occur, thereby reducing the resulting deterioration of the imaging characteristic.

Figure 8:
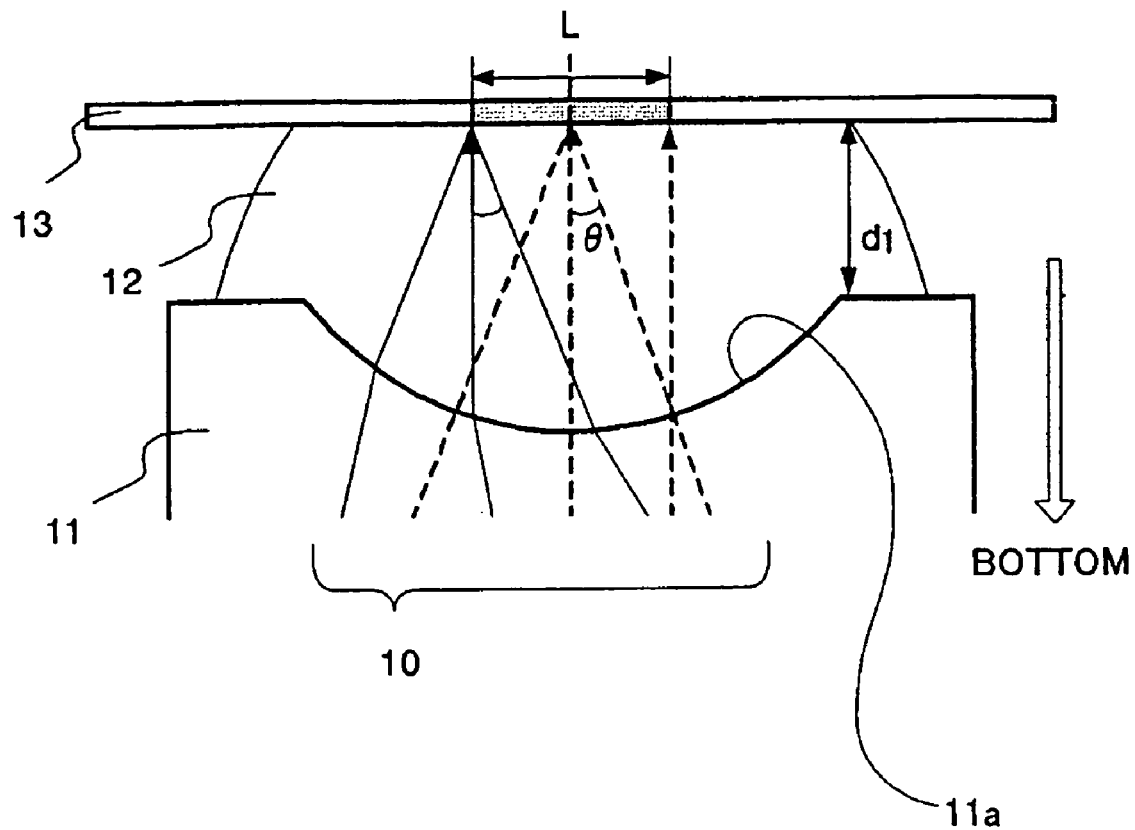
FIG. 8 is a sectional view showing a variation of an immersion optical system according to the first embodiment.

Conventionally, in order to stably hold the wafer and drive the stage, the final lens surface is made to face down in the gravity direction or an installation surface direction of the entire optical system. Therefore, the wafer's exposure surface opposes to the final lens surface. On the other hand, in comparison with the conventional structure, it is possible to easily fill the immersion material in a space between the wafer and the final lens surface by directing the final lens surface up side down so that the final lens surface faces up or opposite to the installation surface of the optical system, irrespective of the concave lens surface shape. FIG. 8 shows a structure in this case. Those elements in FIG. 8 which are the corresponding elements in FIG. 4 are designated by the same reference numerals, and a description thereof will be omitted. In FIG. 8, the final lens surface 11a of the final lens 11 is faced up, and the wafer 13's exposure surface faced down in the gravity direction. The wafer 13 is held by a wafer chuck (not shown), and driven by the wafer stage. The immersion material 12 is held on the final lens surface 11a by the surface tension.

Use of such a structure would enable the immersion material to be easily filled in a space between the final lens and the wafer irrespective of the concave final lens surface, preventing the air bubbles from remaining on the concave lens surface. Therefore, a pattern can be transferred with no defect throughout the exposure area.

When the final lens surface 11a applies a structure that enhances a surface tension by adding a hydrophobic thin film and fine processing, a distance d1 greater than a predetermined value can be secured between the periphery (upper part) of the final lens 11 and the wafer 13. This structure maintains a stable contact between the wafer 13 and the immersion material 12, prevents a contact between the wafer 13 and the final lens 11, and secures an arrangement space for the focus detector.

Figure 9:
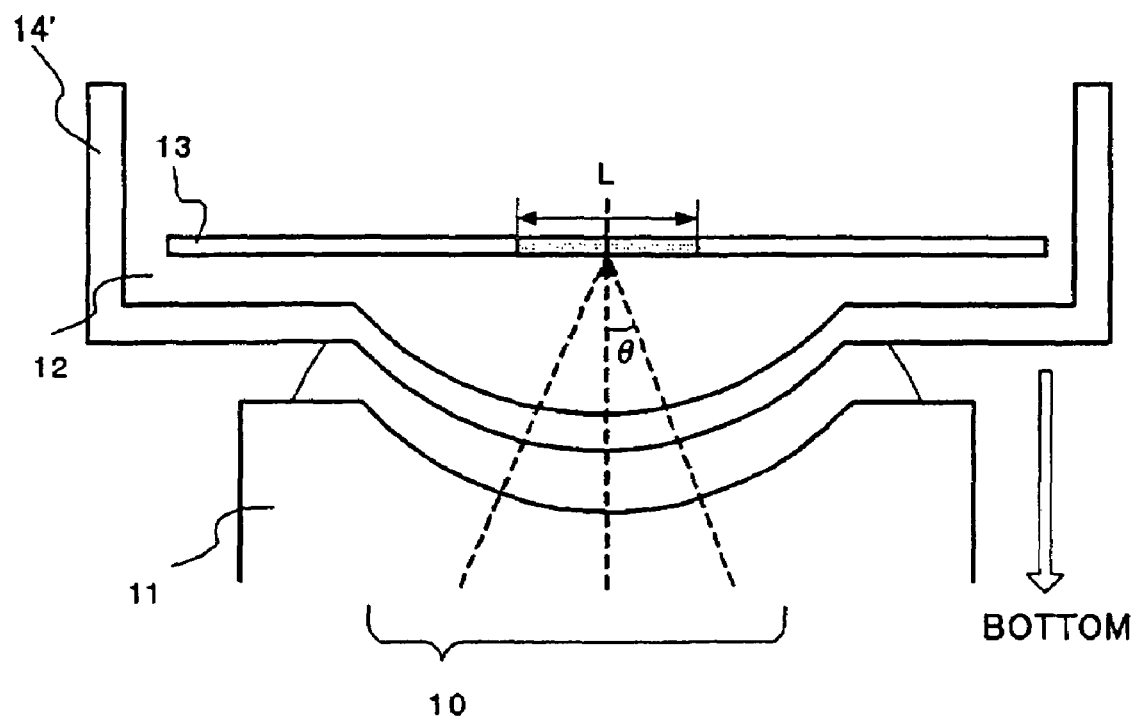
FIG. 9 is a sectional view of an immersion optical system of the variation shown in FIG. 8, which has an immersion material tank.

Of course, as shown in FIG. 8, even when the exposure surface of the wafer 13 faces down, it is possible to provide a tank 14' that stores the immersion material 12. FIG. 9 shows this structure. In FIG. 9, the light transmitting part in the tank 14' is made of an optically transparent material.

Use of such a structure would enable the immersion material 12 having a refractive index greater than 1 to be filled in a space between the final lens surface 11a and the wafer 13 even when the exposure surface of the wafer 13 faces down, increasing the NA of the optical system and successfully transferring a fine pattern.

As discussed, this embodiment uses a concave final lens surface and requires a predetermined condition with respect to the distance d, and provides a higher NA of the optical system than that where the flat final lens surface is used. When this embodiment is applied to the projection optical system in the exposure apparatus, the reflectance of the light having the maximum incident angle can be reduced throughout the exposure area.

In particular, when the immersion material having a refractive index higher than that of the glass material, the NA can be increased up to the refractive index of the glass material and the reflectance of the light having the maximum incident angle can be further reduced.

Since the distance d and the absorption coefficient α satisfies a predetermined relationship, the light absorption can be restrained. Therefore, the exposure apparatus can restrain an increase of exposure time of a wafer, improving the throughput irrespective of the immersion lithography.

NUMERICAL EXAMPLE

A numerical example will now be given of the (concave) final lens surface's radius of curvature r and the distance (liquid thickness) d which enable the maximum NA to be greater than the refractive index nl of the glass material, when the refractive index ni of the immersion material is greater than the refractive index nl of the glass material of the final lens.

Figure 10:
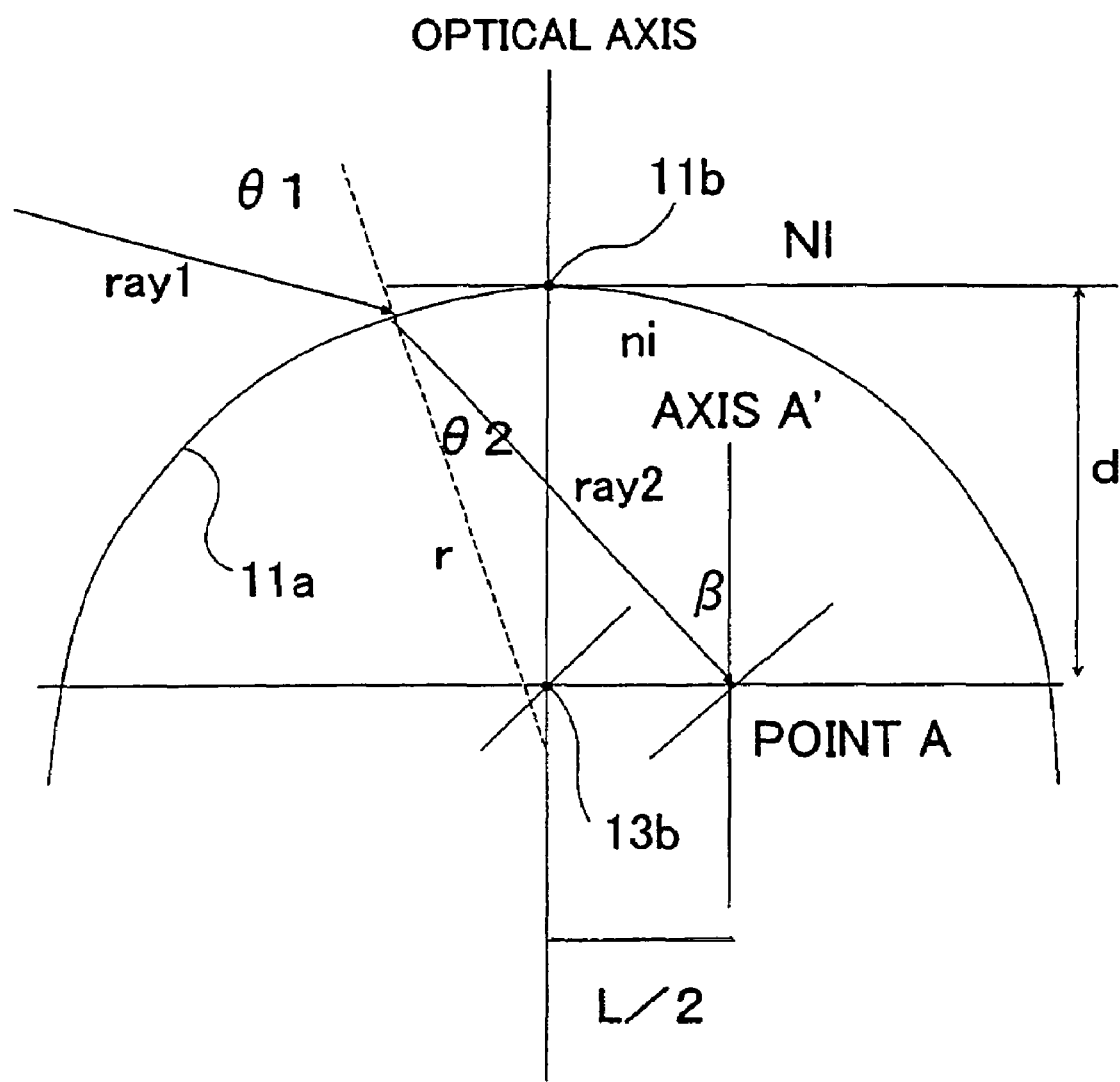
FIG. 10 is a schematic view showing a numerical example of the present invention.

FIG. 10 is a view for explaining the light's refraction in the final lens surface when the final lens's glass material has a refractive index of ni, the immersion material has a refractive index of ni (>nl), and the final lens surface has a radius of curvature of r.

The Snell's law defines the light's refraction at the interface. FIG. 10 shows that a ray 1 from the lens is incident upon a final concave surface at an angle θ1 relative to a surface normal of the final concave surface, is refracted on the final concave surface, is turned to a ray 2 at an angle θ2 relative to the surface normal, and reaches a point A on an image plane or a first surface. In this case, the following Snell's law is met:

$$nl \cdot \sin(\theta 1) = ni \cdot \sin(\theta 2) \qquad (4)$$

In addition, the NA of the optical system is given below, where β is an angle between the ray 2 and the normal of the image plane, and the ray 2 is an outermost ray that defines the NA in the light:

$$NA = ni \cdot \sin(\beta)$$

Another law, the light retrograde law, is also known according to which when a predetermined light ray exists when there can be light that proceeds inversely along the same path.

Now suppose that the point A on the image plane has the highest image point. Given a light that passes the point A and travels backward to the lens side, there exists a light that reaches the point A from the lens side.

In order to evaluate the NA's limit, assume the light that travels back from the point A in a direction from the image plane side to the lens side at an angle β relative to the normal of the image plane. Then, S=ni·sin(θ2)/nl is calculated with respect to the light that travels back from the point A toward the lens side.

When S has a value of 1 or smaller, it is understood that there is the light that travels backward proceed to the lens side, the light that reaches the point A along the same route inverse to the retrograde light, and this optical system has an NA given by ni·sinβ.

Figure 11:
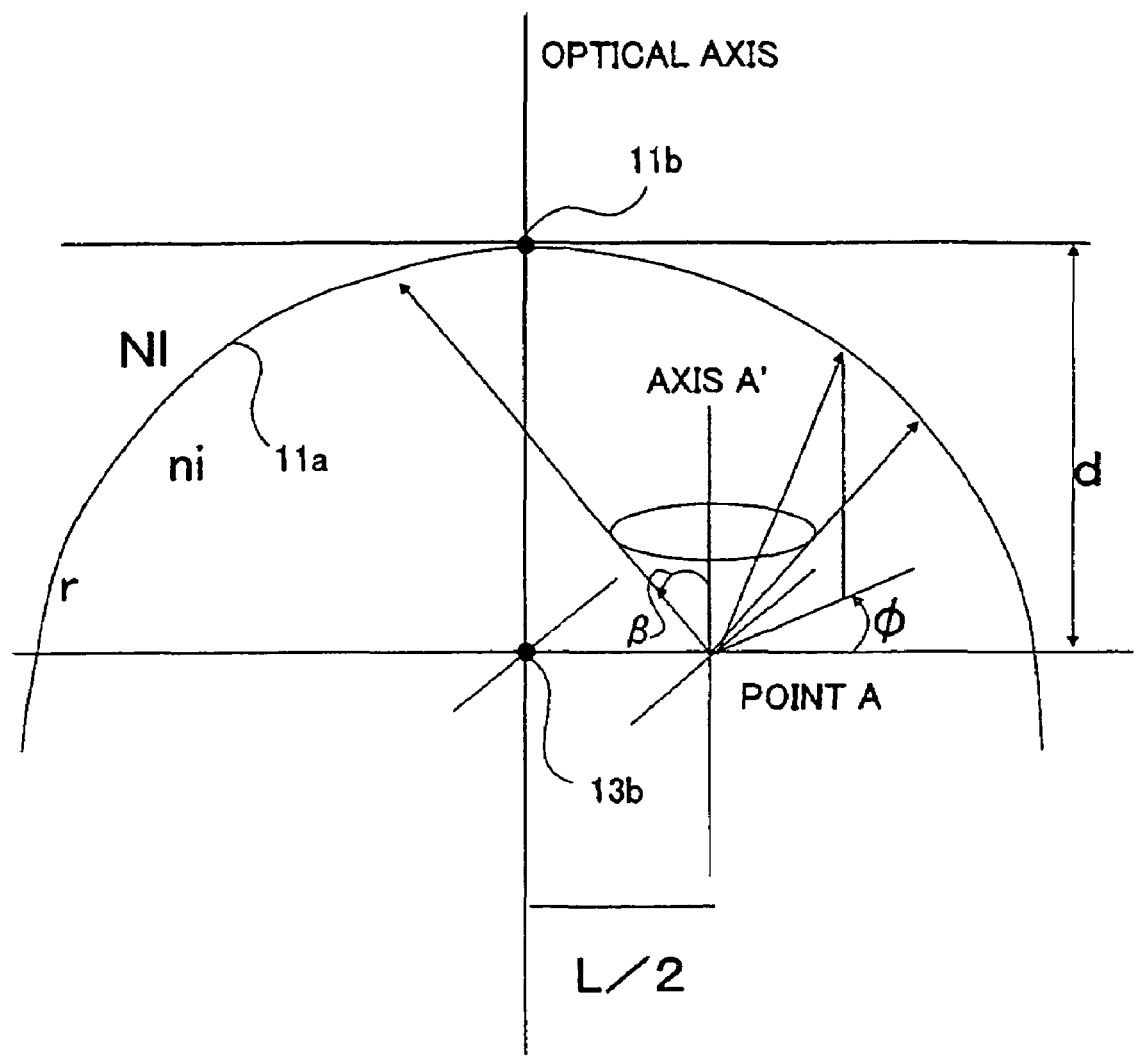
FIG. 11 is a schematic view showing a numerical example of the present invention.

FIG. 11 is a view for explaining a method for evaluating whether the given NA is valid by calculating S. Those elements in FIG. 11 which are corresponding elements in FIG. 10 are designated by the same reference numerals.

S is calculated in the azimuth angle φ0° to 180° with respect to the light that proceeds to the lens side while inclining at the angle β (ni·sin β=NA) to an axis A' that extends from the point A as a maximum image point on the image plane for the given NA and is parallel to the optical axis. If S<1 for all the azimuth angles φ, the given NA is valid.

Figure 12:
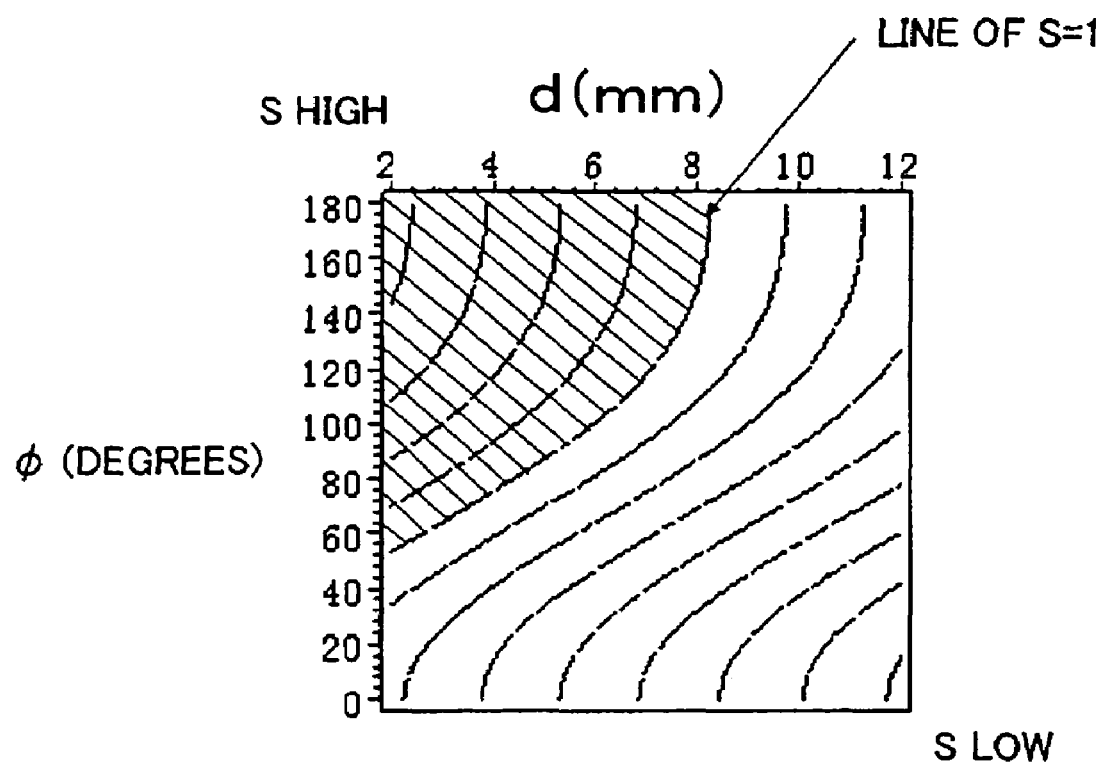
FIG. 12 is a graph showing a calculation result of a numerical example of the present invention.

FIG. 12 shows a calculation result of S with a liquid thickness d and azimuth angle φ as variables, and demonstrates that NA=1.6 is effective under the conditions of nl=1.56, ni=1.64, r=−150 mm, NA=1.6, and the maximum image point L/2=20 mm. S>1 in an upper left area (or hatched area) of a line S=1 and S<1 in an lower right area in FIG. 12. When S<1 is met, the light for the area exists. This result demonstrates that when d>8.2 mm, S<1 for all the azimuth angles φ, and NA=1.6 is valid.

When this is applied to Equation (2), the liquid thickness d becomes d>4.5 mm and it is clear that there is no value of d that satisfies S<1 for all the azimuth angles φ when d<4.5 mm is met.

Figure 13:
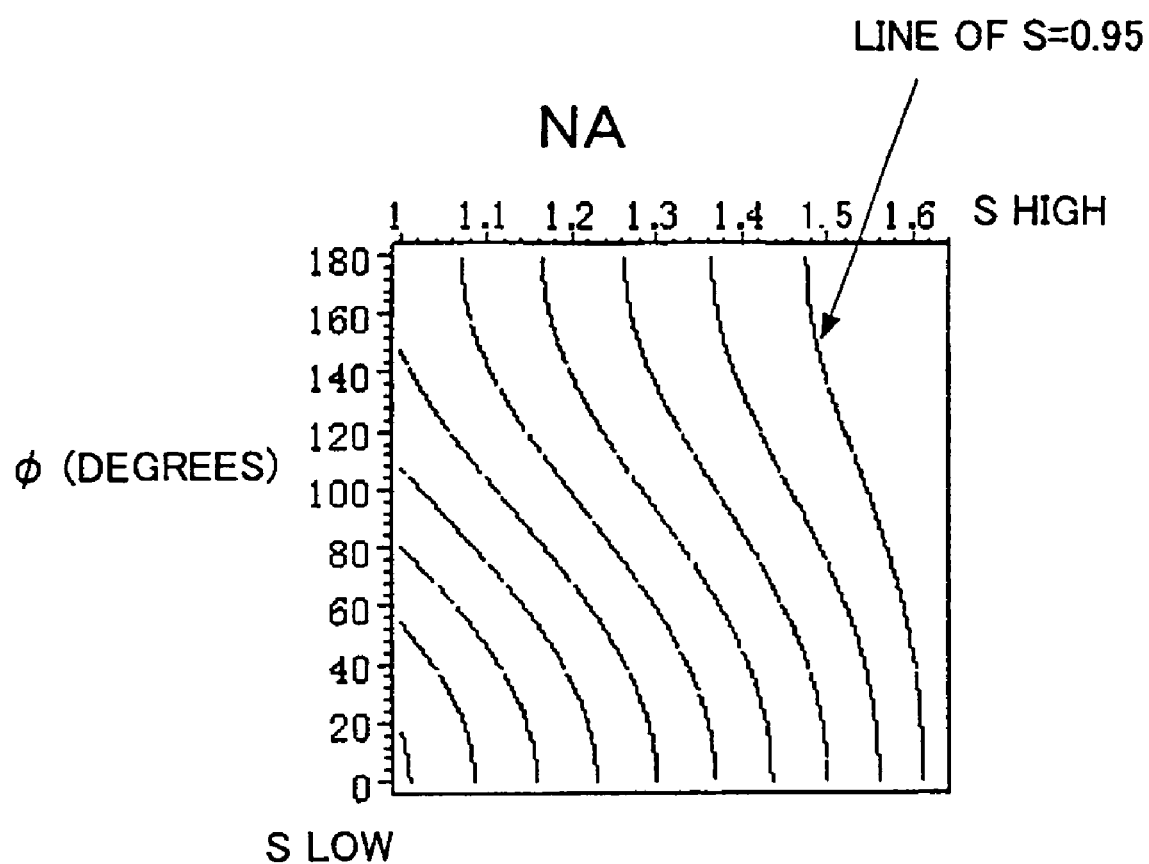
FIG. 13 is a graph showing a calculation result of a numerical example of the present invention.

FIG. 13 shows a calculation result of S with an azimuth angle φ and NA as variables, and demonstrates that NA=1.6 is valid under the conditions of nl=1.56, ni=1.64, r=−150 mm, liquid thickness d=9 mm, and the maximum image point L/2=20 mm.

Figure 15:
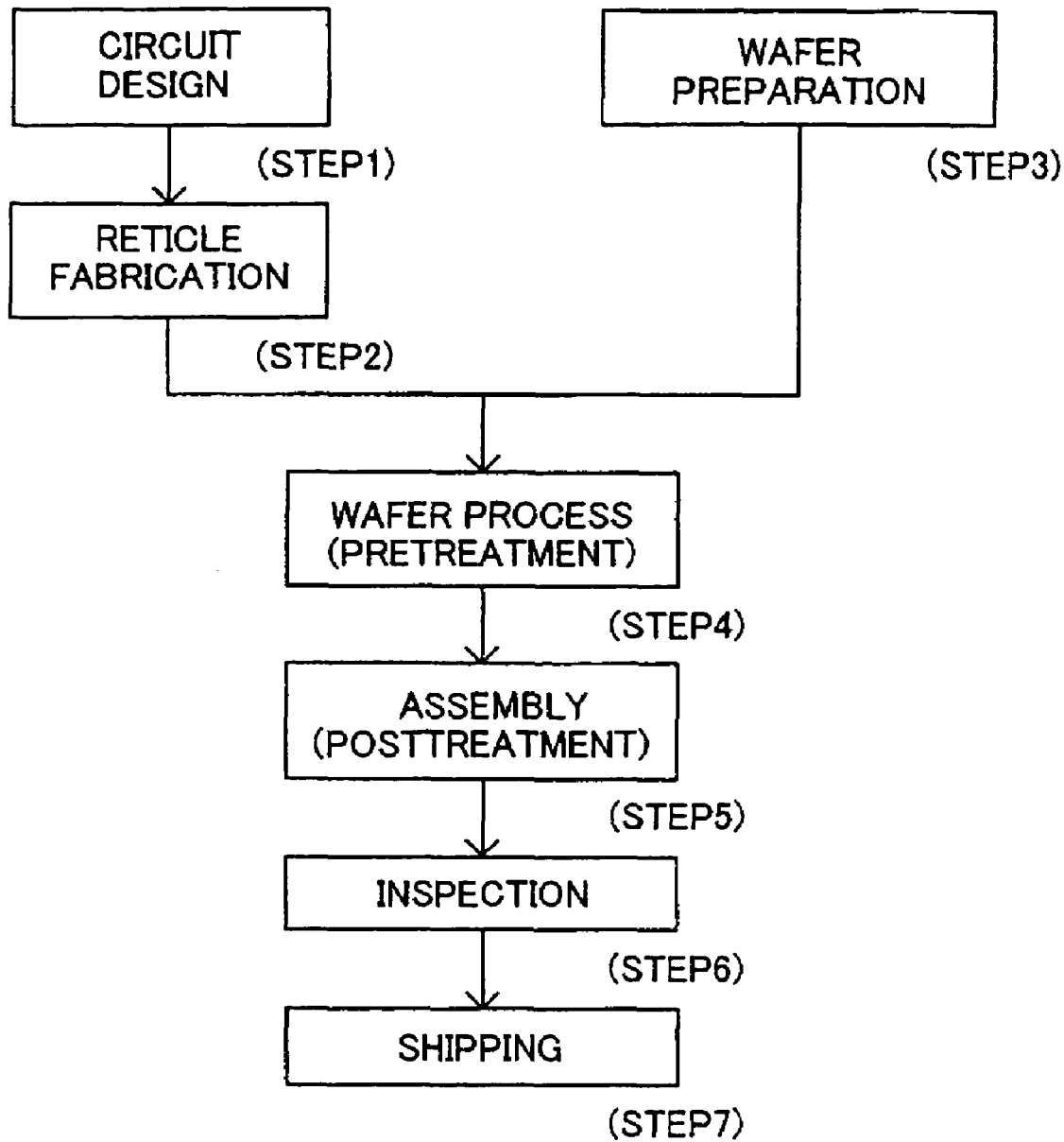
FIG. 15 is a flowchart of a device manufacturing process using a semiconductor exposure apparatus.
Figure 16:
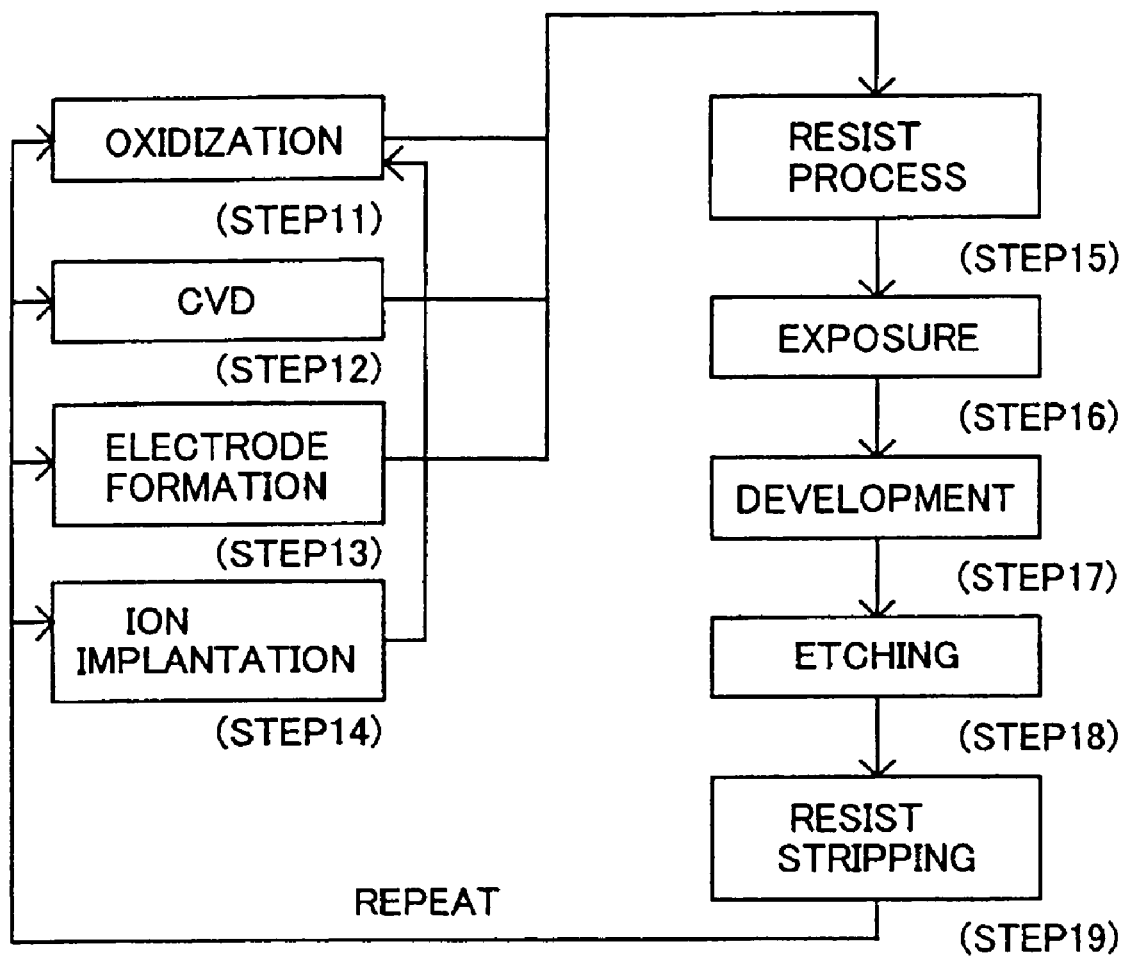
FIG. 16 is a flowchart of a device manufacturing process using a semiconductor exposure apparatus.

Referring now to FIGS. 15 and 16, a description will be given of an embodiment of a device manufacturing method using the above exposure apparatus 100. FIG. 15 is a flowchart for explaining how to fabricate devices (i.e., semiconductor chips such as IC and LSI, LCDs, CCDs, and the like). Here, a description will be given of the fabrication of a semiconductor chip as an example.

Step 1 (circuit design) designs a semiconductor device circuit. Step 2 (reticle fabrication) forms a reticle 101 having a designed circuit pattern. Step 3 (wafer preparation) manufactures a wafer 103 using materials such as silicon.

Step 4 (wafer process), which is also referred to as a pretreatment, forms the actual circuitry on the wafer 103 through lithography using the reticle 101 and wafer 103.

Step 5 (assembly), which is also referred to as a post-treatment, forms into a semiconductor chip the wafer 103 formed in Step 4 and includes an assembly step (e.g., dicing, bonding), a packaging step (chip sealing), and the like.

Step 6 (inspection) performs various tests on the semiconductor device made in Step 5, such as a validity test and a durability test. Through these steps, a semiconductor device is finished and shipped (Step 7).

FIG. 16 is a detailed flowchart of the wafer process in Step 4. Step 11 (oxidation) oxidizes the wafer's surface. Step 12 (CVD) forms an insulating layer on the wafer 103's surface. Step 13 (electrode formation) forms electrodes on the wafer 103 by vapor disposition and the like.

Step 14 (ion implantation) implants ions into the wafer 103. Step 15 (resist process) applies a photosensitive material onto the wafer 103.

Step 16 (exposure) uses the exposure apparatus 100 to expose a circuit pattern from the reticle 101 onto the wafer 103. Step 17 (development) develops the exposed wafer 103. Step 18 (etching) etches parts other than a developed resist image. Step 19 (resist stripping) removes unused resist after etching.

These steps are repeated to form multi-layer circuit patterns on the wafer.

Thus, the device manufacturing method using the exposure apparatus 100, and resultant devices constitute one aspect of the present invention.

Second Embodiment

While the first embodiment describes the immersion optical system used for a projection optical system in a semiconductor exposure apparatus, the inventive immersion optical system is applicable to another optical system in an optical apparatus, such as an optical disc drive, a laser microscope, which optically records information and reproduces recorded information.

Figure 17:
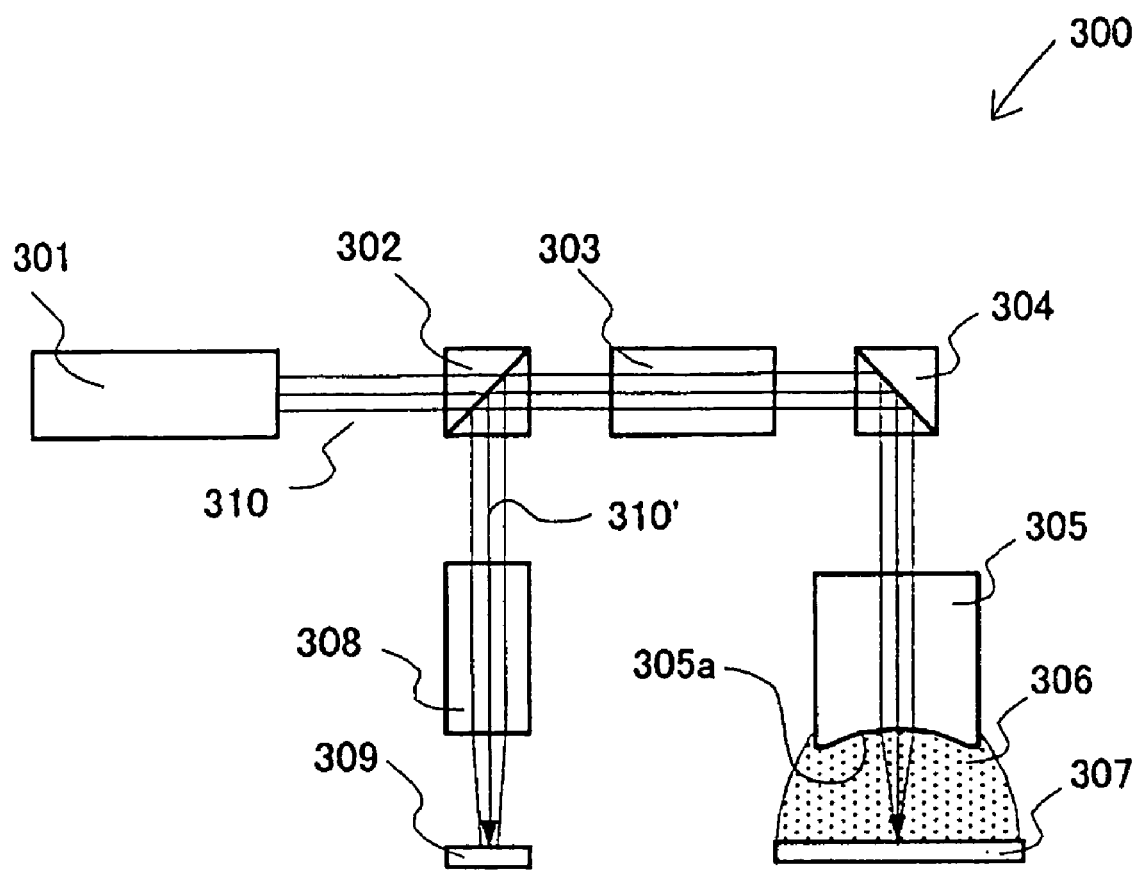
FIG. 17 is a schematic view showing a structure of a laser microscope having the immersion optical system according to the second embodiment.
Figure 18:
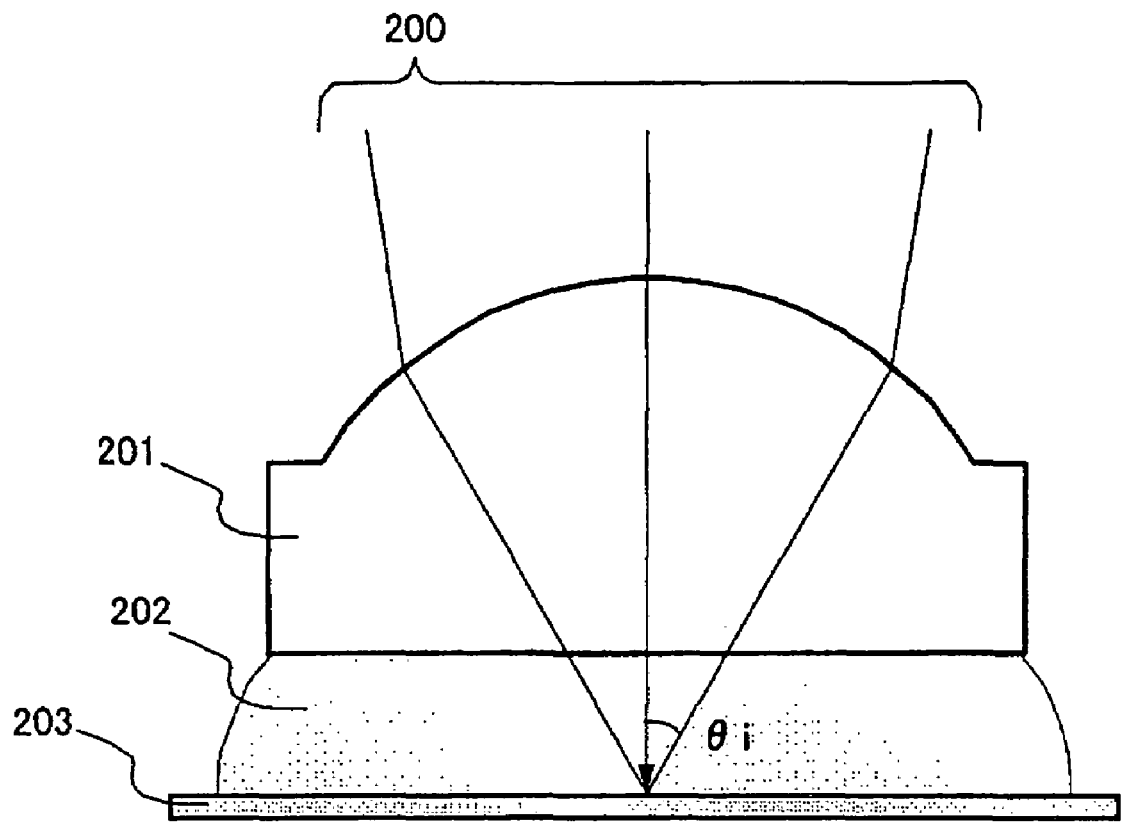
FIG. 18 is a sectional view showing a conventional immersion optical system.
Figure 19:
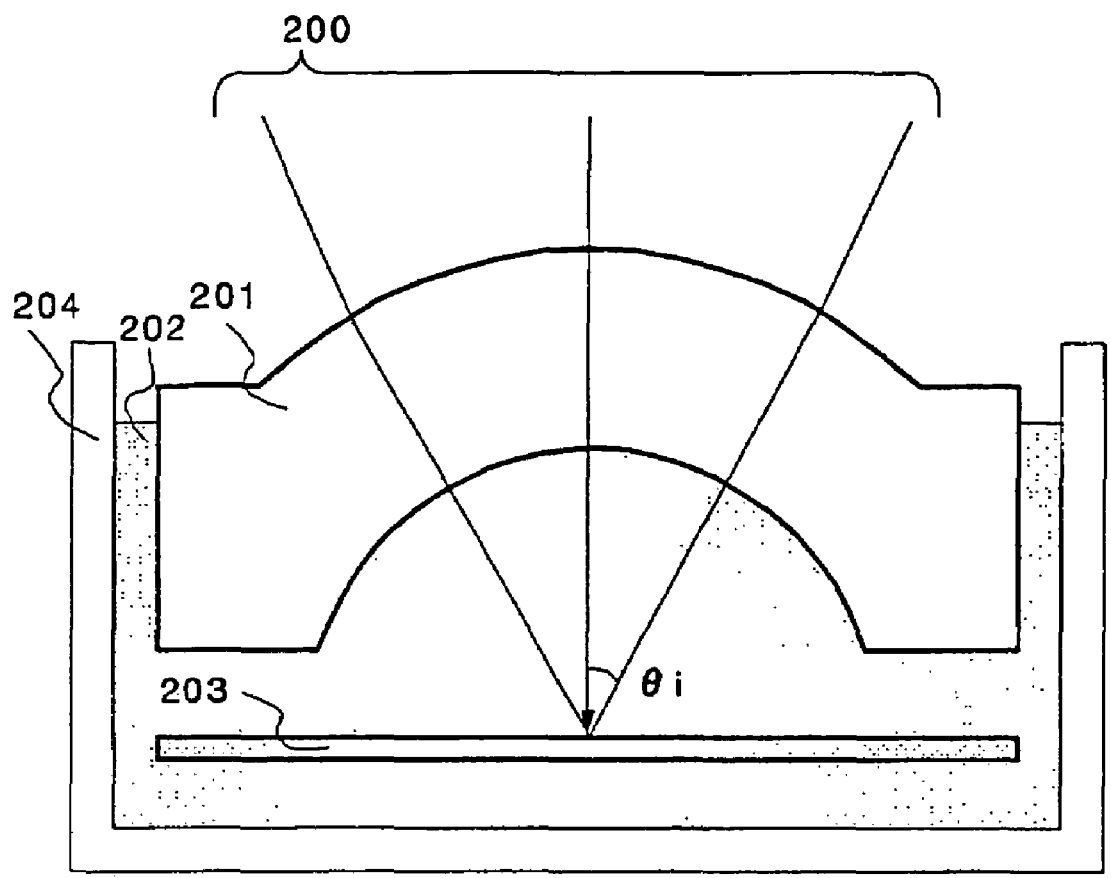
FIG. 19 is a sectional view showing a conventional immersion optical system.
Figure 20:
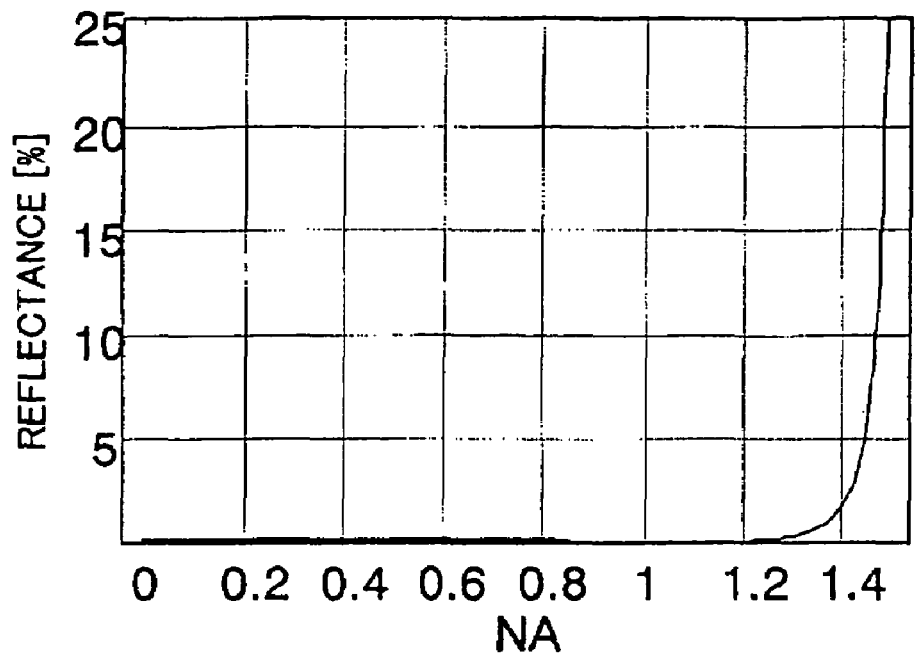
FIG. 20 is a graph showing a relationship between an NA and reflectance in the conventional immersion optical system.
Figure 21:
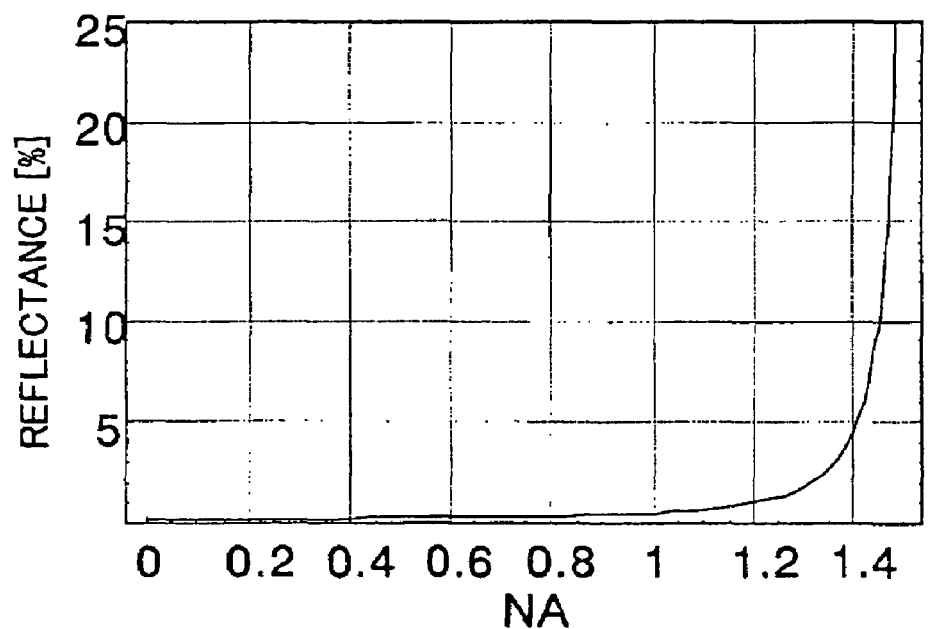
FIG. 21 is a graph showing a relationship between an NA and reflectance in the conventional immersion optical system.

Referring now to FIG. 17, a description will be given of an immersion optical system used for an objective optical system in a laser microscope 300. In the laser microscope 300, a laser beam 300 emitted from a light source 301 transmits a beam splitter 302 and is scanted by an X-Y scanning optical system 303. The scanned beam 3130 is reflected on a mirror 304, and then irradiated on a target 307 to be observed. An immersion material 306 is filled in a space between a final lens surface 305a and the target 307 in the objective optical system 305, and the beam 310 is emitted and converged from the final lens surface 305a, and reaches the target 307 after transmitting the immersion material 306.

The beam 310' reflected on the target 307 trances an inverse optical path in order of the objective optical system 305 including the immersion material 306, the mirror 304 and the X-Y scanning optical system 303. The beam 310' is reflected by the beam splitter 302 and introduced to a condenser optical system 308, and finally irradiated on a light-receiving element 309. The image formed by the beam 310' irradiated onto the light-receiving element 309 is converted into an electric signal by the light-receiving element 309, and then converted into image data by an image data processor (not shown).

Alternatively, a pinhole may be arranged as a spatial filter in front of the light-receiving element 309, and the beam splitter 302 may be made a polarization beam splitter.

Furthermore, the present invention is not limited to these preferred embodiments and various variations and modifications may be made without departing from the scope of the present invention.

This application claims a benefit of priority based on Japanese Patent Application No. 2005-000616, filed on Jan. 5, 2005, which is hereby incorporated by reference herein in its entirety as if fully set forth herein.

What is claimed is:

1. An immersion optical system that condenses light from a light source toward a first surface, said immersion optical system comprising a lens having a concave lens surface closest to the first surface, a liquid being filled in a space between the concave lens surface and the first surface, wherein a conditional equation $d>L/[2\times\tan\{\arcsin(NA/ni)\}]$ is met, where d is a distance between a first point and a second point when the distance becomes maximum between the first point on the concave lens surface and the second point on the first surface in a direction substantially orthogonal to the first surface, L/2 is a maximum distance from the second point to an edge of an irradiation area of the light on a first surface, NA is a numerical aperture of said immersion optical system, and ni is a refractive index of the liquid.

2. An immersion optical system according to claim 1, wherein the lens is made of a glass material, and a conditional equation nl<ni is met, where nl is a refractive index of a glass material of the lens.

3. An immersion optical system according to claim 1, wherein a conditional equation $d<0.3/\alpha$ is met, wherein $\alpha$ is a absorption coefficient of the liquid, which is an inverse of a distance at which an intensity of the light that passes the liquid becomes one-tenth.

4. An optical apparatus comprising:
a light source; and
an immersion optical system according to claim 1.

5. An exposure apparatus comprising:
an illumination optical system for illuminating an original by using light from a light source; and
an immersion optical system for projecting a pattern of the original according to claim 1.

6. A device manufacturing method comprising the steps of:
exposing a target by utilizing an exposure apparatus according to claim 5; and
developing the target that has been exposed.

* * * * *

UNITED STATES PATENT AND TRADEMARK OFFICE
CERTIFICATE OF CORRECTION

PATENT NO. : 7,199,939 B2
APPLICATION NO. : 11/319195
DATED : April 3, 2007
INVENTOR(S) : Akinori Ohkubo et al.

It is certified that error appears in the above-identified patent and that said Letters Patent is hereby corrected as shown below:

COLUMN 1:
    Line 66, "passes the" should read -- passes through the --.

COLUMN 2:
    Line 14, "where n1" should read -- where $n\ell$ --.
    Line 19, "sin θi" should read -- $\sin\theta i$ --.
    Line 27, "n1" should read -- $n\ell$ --.
    Line 28, "θ1" should read -- $\theta\ell$ --.
    Line 35, "sin θi" should read -- $\sin\theta i$ --.

COLUMN 4:
    Line 44, "first or" should read -- first surface or --.

COLUMN 7:
    Line 18, "index n1" should read -- index $n\ell$ --.
    Line 19, "ni0<ni," should read -- $ni0 < n\ell$ --.
    Line 25, "NAO=ni0xsin θi" should read -- $NAO = ni0 \times \sin\theta i$. --.

COLUMN 8:
    Line 40, "θ1" should read -- $\theta\ell$ --.
    Line 41, "sin θ1" should read -- $\sin\theta\ell$ --.
    Line 47, "with" should read -- has --.
    Line 63, "$n\ell$" should read -- ni --.

COLUMN 10:
    Line 22, "filter etc. remove" should read -- filter, etc., remove --.
    Line 59, "temperature the" should read -- temperature of the --.

COLUMN 12:
    Line 28, "satisfies" should read -- satisfy --.
    Line 44, "ni," should read -- $n\ell$, --.
    Line 65, "exists" should read -- exists, --.
    Line 66, "when" should be deleted.

COLUMN 13:
    Line 12, "proceed" should read -- proceeding --.
    Line 14, "inverse" should read -- inversely --.
    Line 32, "an" should read -- a --.

UNITED STATES PATENT AND TRADEMARK OFFICE
CERTIFICATE OF CORRECTION

PATENT NO. : 7,199,939 B2
APPLICATION NO. : 11/319195
DATED : April 3, 2007
INVENTOR(S) : Akinori Ohkubo et al.

It is certified that error appears in the above-identified patent and that said Letters Patent is hereby corrected as shown below:

COLUMN 14:
    Line 31, "laser beam 300" should read -- laser beam 310 --.
    Line 32, "transmits a" should read -- transmits through a -- and "scanted" should read -- scanned --.
    Line 39, "transmitting the" should read -- transmitting through the --.
    Line 41, "trances" should read -- traces --.

COLUMN 15:
    Line 18, "a" should read -- an --.

COLUMN 16:
    Line 1, "passes the" should read -- passes through the --.

Signed and Sealed this

Twenty-seventh Day of May, 2008

JON W. DUDAS
*Director of the United States Patent and Trademark Office*